United States Patent [19]

Satou et al.

[11] Patent Number: 4,490,706
[45] Date of Patent: Dec. 25, 1984

[54] ELECTRONIC PARTS

[75] Inventors: Hiroshi Satou; Tadao Yahagi, both of Akita, Japan

[73] Assignee: TDK Corporation, Tokyo, Japan

[21] Appl. No.: 396,208

[22] Filed: Jul. 8, 1982

[30] Foreign Application Priority Data

Jul. 9, 1981 [JP] Japan .................. 56-101189
Mar. 23, 1982 [JP] Japan .................. 57-40544
Mar. 23, 1982 [JP] Japan .................. 57-40546
May 8, 1982 [JP] Japan .................. 57-66849

[51] Int. Cl.³ .................. H01F 27/04; H01F 15/10
[52] U.S. Cl. .................. 336/96; 336/192
[58] Field of Search .................. 361/307, 308, 309, 310, 361/306; 336/192, 96, 65, 105; 338/273, 274, 275, 322, 324

[56] References Cited

U.S. PATENT DOCUMENTS

| 1,727,581 | 9/1929 | Wood et al. | 361/306 |
| 3,295,056 | 12/1966 | Matsushima et al. | 336/105 |
| 3,824,518 | 7/1974 | Slenker | 336/96 |
| 4,064,472 | 12/1977 | Gunewardena et al. | 336/192 X |
| 4,149,135 | 9/1979 | Roespel et al. | 336/65 |
| 4,247,883 | 1/1981 | Thompson et al. | 361/306 |

FOREIGN PATENT DOCUMENTS

| 913450 | 6/1954 | Fed. Rep. of Germany | 361/307 |
| 3036913 | 10/1981 | Fed. Rep. of Germany | 336/192 |

*Primary Examiner*—Thomas J. Kozma
*Attorney, Agent, or Firm*—Seidel, Gonda & Goldhammer

[57] ABSTRACT

An electronic part comprising an electronic element provided with connector electrodes at both ends, a pair of terminals connected to said both electrodes and extended downwardly therefrom, and a covering of molded insulating resin encasing said electronic element with the exception of the outer end portions of said terminals, said outer end portions being bent to fit the bottom of said covering and then folded vertically upward in contact with the both ends of said covering.

3 Claims, 31 Drawing Figures

FIG.IA
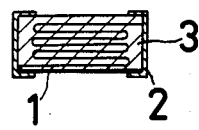
FIG.1B
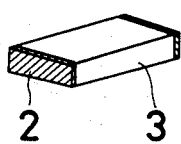
FIG.2A
FIG.2B
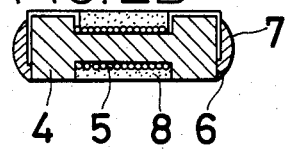
FIG.2C
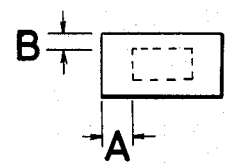
FIG.3A
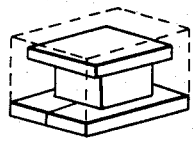
FIG.3B
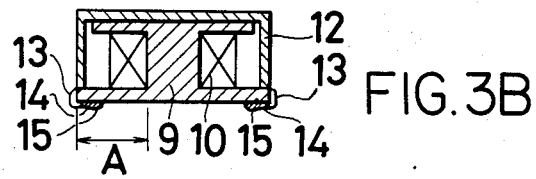
FIG.3C
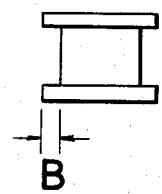

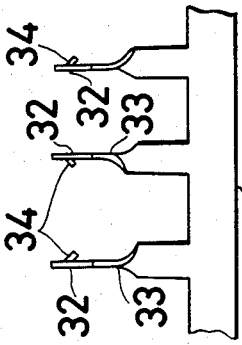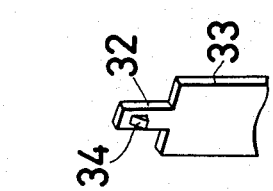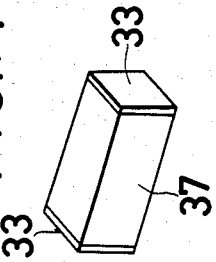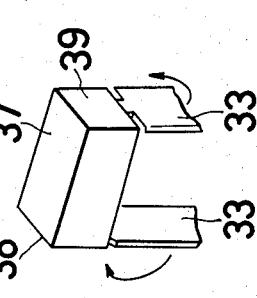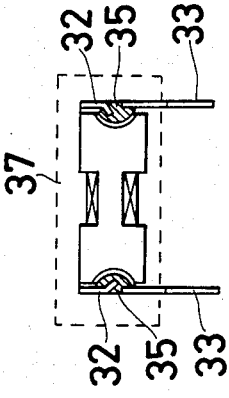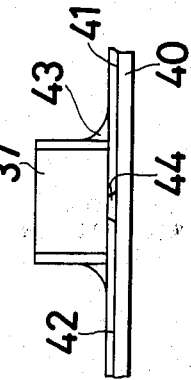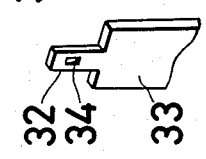

FIG.21
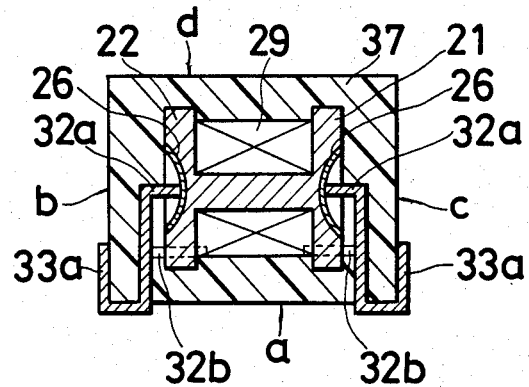
FIG.22  FIG.23  FIG.24  FIG.25
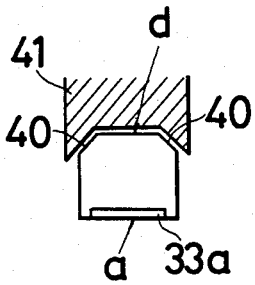 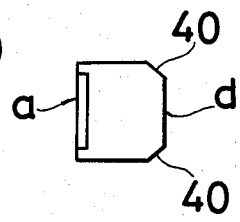 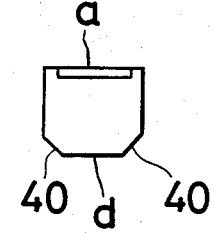 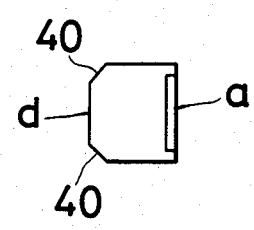

ELECTRONIC PARTS

BACKGROUND OF THE INVENTION

This invention relates to electronic parts, and more specifically to chip inductors.

Many different chip inductors have hitherto been introduced or brought into use. They are roughly divided into two types, those made by the lamination technique and those using rectangular magnetic cores. An advantage common to the both is smallness in size.

A few typical constructions will be described below with reference to the accompanying drawings. FIG. 1 shows a laminated chip inductor made by printing a coil-forming conductor 1 on each lamination of a magnetic (insulating) coating material 3 (the laminate being shown as having been sintered and therefore without inter-lamination seams) and repeating the run a number of times until a spiral conductor pattern, printed from lamination to lamination, forms a coil, covering the laminate with outermost layers to provide protection, and finally covering the both ends of the laminate with external-terminal electrodes 2 as terminals of the resulting coil. Inductors of this type are integrated in construction, small in size, and directly solderable to printed circuit boards and the like. Moreover, the structure requires no lead wire. In contrast with these and other advantages, they have a major disadvantage of a low self-resonance frequency with a large distributed capacity, because the conductor in the film form makes the inductor similar in construction to a laminated capacitor. Consequently, the dielectric loss is large and Q is lowered. Where a change in the inductance is desired the number of laminations must be changed correspondingly. This means an alteration in the thickness of the inductor according to the inductance required, which renders standardization of inductor sizes difficult. Furthermore, controlling the thickness of the magnetic coating films is so cumbersome that it often causes undesired variations of L and Q values. For the coil-forming conductor a precious metal, such as Ag or Ag-Pd alloy, must be used, and the thin-film conductor so formed naturally has high resistance to electric current. In addition, since the coil-forming conductor and its neighboring portions are all embedded in the magnetic material, the closed magnetic path or circuit causes early magnetic saturation and deteriorates the DC bias property of the product. Besides, there is a limitation to the number of turns in the coil formed by printing, and a high inductive intensity cannot be obtained.

FIG. 2 illustrates a conventional chip inductor using a rectangular magnetic core. This inductor is built by winding a wire 5 round recessed portions on four sides of a magnetic core 4 which is generally flat, rectangular parallelopiped recessed in the middle, extending the both ends of the wire forming the coil to the both ends of the rectangular core, connecting the wire ends or terminals to respective filmy electrodes 6 by means of solder 7, and then filling up the recesses with a resin 8 to protect the coil and finish the whole as a flat, rectangular parallelopiped. The product again has varied merits as a chip inductor and also shortcomings of large eddy current loss and very low Q (about 2 to 10) because of the rather broad electrode films on the both ends of the magnetic core. The depth B of the recesses in the thickness direction (vertical as viewed in FIG. 2) is necessarily less than the depth A of the recesses in the width direction. As a consequence, the absolute number of turns of the wire cannot be increased beyond a certain limit and hence the inductance of the coil is limited. A further disadvantage of this type is the necessity of an extra, knotty step of molding an insulating resin around the coil for its protection.

FIG. 3 shows another example of ordinary chip inductor using a rectangular magnetic core. The core 9 consists of a square stem having on both ends two square flanges dissimilar in shape and size. On the square stem, or in the recesses between the flanges, a wire 10 is wound into a coil, the both ends 13 of the coil are pulled round the edges of the larger flange and secured to electrodes 15 on the reverse side of the flange by means of solder 14, and then a protective cap 12 is fitted onto the smaller flange and the stem. Here again the dimension widthwise and therefore the inductance of the coil are restricted. The exposed coil ends can be broken by contact with other parts, thus affecting the reliability of the device. Moreover, because the electrodes to act as external terminals cannot be secured to any points other than at the bottom, the inductor is difficult to attach onto a printed circuit board and, if attached, the bond fails to possess adequate strength.

SUMMARY OF THE INVENTION

The present invention has for its object the provision of electronic parts which eliminate at least serious ones of the disadvantages the inductors of the prior art have.

Chip inductors according to the invention are of a construction such that the both terminals or ends of the coiled wire can be infallibly pulled to the outside, the construction making possible the confirmation and accurate electrical connection of the terminals, sealing and reinforcement of the chip inductor, and positive, dependable electrical connection to the wiring on a printed circuit board. This combines with excellence of the inductive construction to permit outstanding performance of the inductors.

Preferred embodiments of the electronic parts of this invention will be described in more detail below with reference to the accompanying drawings.

BRIEF DESCRIPTION OF THE DRAWINGS

FIG. 1 shows a chip inductor of the prior art, in section A and in perspective B;

FIG. 2 shows another conventional chip inductor, in perspective A, in section B, and from one end C;

FIG. 3 shows still another conventional chip inductor, in perspective A, in section B, and from one end C;

FIG. 9 is a sectional view of the above core with a coil formed thereon;

FIGS. 10 and 11 are fragmentary perspective views of a reed frame having heads 32 and broader flaps 33 to serve as external electrode terminals;

FIG. 12 is a sectional view of the assembly after resin molding;

FIG. 13 is a perspective view of the assembly in FIG. 12;

FIG. 14 is a perspective view of the assembly on which, after the resin molding, the broad flaps 33 have been folded back against the both ends 38, 39 of the chip body and the excess portions have been cut off;

FIG. 15 is a sectional view of the product in FIG. 14;

FIG. 16 is a perspective view of the chip inductor of the invention as attached to a printed circuit board;

FIG. 21 is a front view in section of the third embodiment;

FIGS. 22 to 25 are sequential views illustrating a method of identifying the direction of an electronic part in a chip form according to the invention;

DETAILED DESCRIPTION OF THE INVENTION

FIGS. 4 through 16 illustrate the manufacturing process and construction of an embodiment of chip inductor according to the invention.

Figure 4:
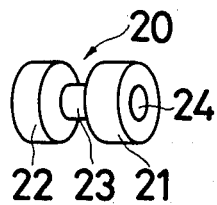
FIG. 4 is a perspective view of a core of a chip inductor embodying the invention.
Figure 5:
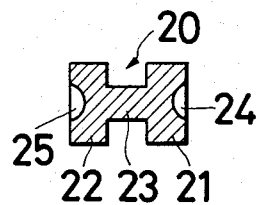
FIG. 5 is a sectional view of the core of the above embodiment.

Referring specifically to FIGS. 4 and 5, there is shown a magnetic or nonmagnetic core 20 of magnetic ferrite, plastics, or the like. The material of the core 20 is chosen in view of the intended use of the product. The core 20 is generally dumbbell-shaped, consisting of a pair of large-diameter cylindrical or roll-like portions 21, 22 connected by a small-diameter cylindrical portion 23 in the middle, all formed as one piece. The intermediate portion 23 provides a sufficient recessed space to accommodate a coil of insulated wire. The both roll-like end portions 21, 22 of the dumbbell-shaped core 20 have circular depressions 24, 25 formed in the centers of their outer sides so as to receive electrodes.

Figure 6:
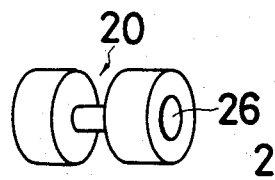
FIG. 6 is a perspective view of the core to the both ends of which electrodes have been attached.
Figure 7:
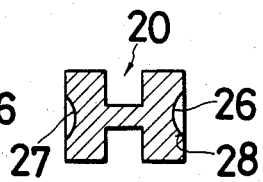
FIG. 7 is a sectional view of the above core.
Figure 8:
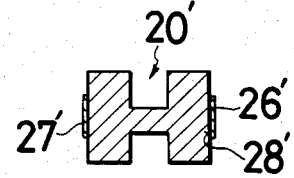
FIG. 8 is a sectional view of a core which is a modification of the first embodiment.

Next, as shown in FIGS. 6 and 7, copper foil electrodes 26, 27 are put into the depressions 24, 25, respectively, and are fixed securely in place by means of epoxy resin or other thermosetting bonding agent 28. In this way electrodes can be fitted to the both extremities of the core. The procedure of making a core having electrodes at both ends according to the invention is not limited to that which has been explained above. For example, the dumbbell-shaped core as indicated at 20' in FIG. 8 may have depression-free, flat outer ends provided the electrodes can be controlled in position or secured in place. In the figure like parts are given like numbers primed with respect to FIGS. 6 and 7. While the description to follow will be based on the method and the core construction illustrated in FIGS. 4 through 7, it is to be understood by those skilled in the art that the present invention is applicable as well to other such cores having electrodes provided at both ends.

Referring to FIG. 9, an insulated wire 29 is wound the number of times required round the core 20 as in FIG. 7, and the both end portions 30, 31 of the resulting coil, stripped of the insulation coating, are electrically connected to electrodes 26, 27, respectively. If necessary, the wire end portions 30, 31 are soldered securely to the electrodes 26, 27. Next, as shown in FIGS. 10 and 11, a pair of thin, conductive metal pieces are prepared. Each piece consists of a narrow head 32 and a broad flap 33, the head being lanced in the middle to provide a projection 34. They are soldered or otherwise fastened to the both ends of the core 20 on which the wire has been coiled. The projections 34 are faced with the electrodes 26, 27 or 26', 27' in the centers of the both core ends so that they serve as anchors when the metal pieces are soldered to the electrodes.

FIG. 11 shows a long, flat shape for use in one method of automatically attaching the metal pieces to cores. The semifinished work is obtained by stamping out a long, thin metal piece which consists of a reed frame 36 supportingly having broad flaps 33 at regular intervals along one edge, each flap having a head 32 with a lanced projection 34. The flaps 33 are then twisted at the shoulder so as to turn their heads 32 face to face as shown in FIG. 11. The twist should be such that the lanced metal projections 34 are alternately turned in opposite directions and two adjacent projections forming each pair face each other. The distance between the heads 32 whose projections 34 are paired in this way is slightly shorter than the length of the core. This enables the metal pieces exert a spring action and get easier hold of the core in between. Next, cores are introduced in the direction of the arrows, and each core is temporarily supported between the opposing projections 34 and is jointed to the latter, as in FIG. 12, by means of solder 35 or other suitable conductive bonding agent. While the cores are being supported by the reed frame 36, a resin 37 in a molten state is injected into the recess around the core and also about the metal pieces and then allowed to set. Following this, the metal pieces supporting the cores are severed from the reed frame 36 and, as indicated by the arrows in FIG. 13, each pair of the metal flaps are folded into close contact with the both ends 38, 39 of the assembly. Finally, as shown in FIGS. 14 and 15, the ends of the flaps are trimmed down to be flush with the top of the assembly. The inductor thus completed in accordance with the present invention takes the form of a rectangular chip having external terminals of thin metal sheet at both ends. The operation so far described, from the assembling to pretesting stages, can be performed by automated equipment while longitudinally feeding the reed frame 36 held by suitable clamps or other movable supports. Some modification in design of the reed frame 36 may make possible the omission and replacement of the conductive metal pieces having twisted portions by those having untwisted, flat portions. Also, the flaps 33 of the conductive pieces may be cut shorter before bending so that, when folded, they cover only lower portions of the end surfaces of the chip inductor instead of the entire end surfaces as in FIGS. 14 and 15.

With the construction described above, the chip inductor of the invention offers a free choice in shape with good dimensional accuracy because it can be resin-molded to any desired configurations practically in disregard of the size or shape of the core. The terminals to be secured in the form of films to the both ends of the chip inductor, unlike the ordinary products provided with leads, permit automatic feeding, bonding, and soldering of the chip inductors to printed circuit boards.

Advantageous effects of the invention may be summarized as below.

(1) Dimensional accuracy is attained.

Conventional protective outer coverings are made of inorganic materials (e.g., ferrite). Ferrite, for instance, shrinks on sintering, leading to increased variation in dimensional accuracy of the coverings. Coverings of this shape usually have to be made within a tolerance of about ±0.2. The covering according to the present invention is formed of resin by use of a mold, and therefore its contour and dimensions are substantially equal to those of the mold cavity. Thus, the covering according to the invention is usually made to a tolerance of only about ±0.05. This minimizes the variation in overall dimensions of individual products and facilitates handling of the chip inductors by the apparatus for automatically attaching them onto printed circuit boards or the like. The apparatus can operate more stably than when handling conventional chip inductors, with fewer troubles such as catches due to variations in configurations.

(2) Manufacturing process is simple.

A modified form of the ordinary lead-type inductors is the product, and the manufacturing process is simpler. By far the greater merit is that the existing equipment (automated machinery, etc.) can be used as they are, with the addition of a few units when necessary. For the process steps of coil winding, reed frame clipping, soldering, and resin molding (which requires a mold for the intended shape), the conventional equipment may be utilized. An additional unit required would be the press to stamp out the reed frame when it is not made outside but within the same factory.

(3) Free choice of inductor shape is allowed.

It is only necessary to prepare a mold of desired cavity contour since it governs the shape of the product as noted above. There is no need of preforming round, square, or other shaped sintered pieces of ferrite or the like as in ordinary inductor making; nor is it necessary to redesign for a desired inductance in view of changes in shape of tubular ferrite bodies.

FIG. 16 shows a chip inductor of the invention attached between conductors 41 and 42 on a printed circuit board 40 by means of solder 43. Numeral 44 designates adhesive used in temporarily securing the inductor to the board surface. The chip inductor according to this invention is rectangular and stable in shape, and lends itself well to handling by an automated line. Thus, freedom from directionality enables this chip inductor to be easily assembled, soldered, and otherwise processed in automated operation.

In addition to the aforedescribed advantages, the rectangular outer coverings permits the use of the cylindrical, dumbbell-shaped magnetic core, giving a broadened choice of number of turns in the coil for its small size.

Figure 17:
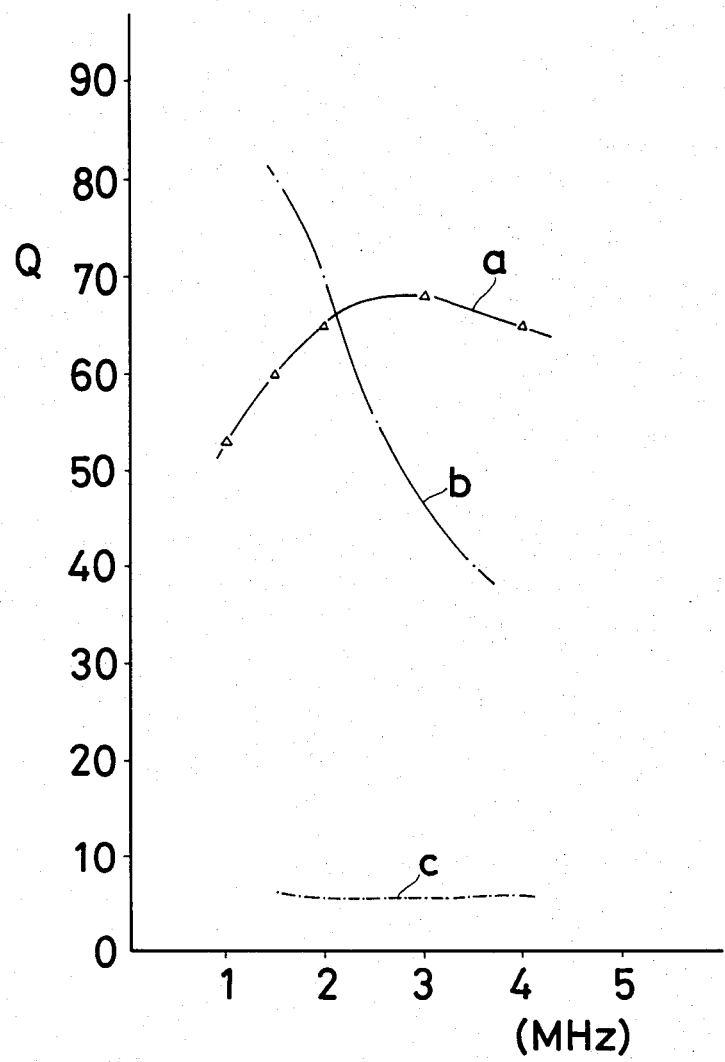
FIG. 17 is a graph comparing the Q-f characteristic of the inductor of the invention with that of a conventional inductor.

The chip inductor of the invention has been found to be greater in Q than the rectangular inductor of the prior art shown in FIG. 2. This is presumably ascribable to the fact that whereas the eddy currents in the inductor of the invention are limited because of the small areas of the heads 32 of the electrodes serving as external terminals, the eddy currents in the conventional inductor develop in the terminal electrodes on a side, too. FIG. 17 graphically represents the Q-f characteristics of an inductor a of this invention, in which a 0.06 mm-dia. wire was coiled in 56 turns to an impedance of 30 μH, and inductors b (without electrodes) and c (with electrodes) in FIG. 2. As can be clearly seen, the inductor of the invention exhibits high impedance of limited variation and well comparable to that of the ordinary lead-type inductor, while the inductors according to FIG. 2 show that the addition of electrodes causes a sharp drop of Q from b to c.

Figure 18:
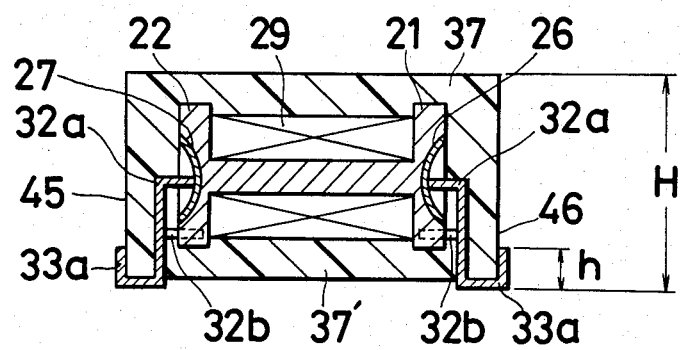
FIG. 18 is a front view, in vertical section, of a second embodiment of the electronic part of the invention.

Referring now to FIG. 18, a second embodiment of the invention will be described. For enhanced packaging density on printed circuit boards and the like, electronic parts in a chip form must, of course, be as small in size as possible. In addition, it should be noted that, if external terminals cover rather large areas as in FIG. 16, there will be increased sags, deposits, and spreads of solder between the chips and the conductor pattern on each printed circuit board. The solder can spread to such an extent that a bridge of solder is formed between the adjacent electronic parts soldered to the conductor pattern of the board, with consequent shortcircuiting. To avoid this, the chip-to-chip distance must be increased at a sacrifice of the packaging density.

The second embodiment of the invention is a chip inductor having terminals controllable in height so as to minimize the sags, deposits, and spreads of solder from the chips and improve the packaging density on printed circuit boards and the like.

In FIG. 18 the reference numerals like those in FIGS. 4 through 16 designate corresponding or similar parts. In the embodiment shown, a pair of metal terminals 33a, electrically connected at one ends to electrodes 26, 27 of an electronic part, are led to the outside of the bottom 37′ of the covering 37 at which the device is to be attached onto the board. The outer end portions of the terminals are then bent from the bottom 37′ and folded up against the both end faces 45, 46 of the chip.

With the construction described, the end portions of the terminals 33a on both ends 45, 46 of the covering 37 can be adjusted in position to control the height h from the bottom 37′ of the folded ends of the terminals 33a as desired. This reduces the sags, deposits, and spreads of solder used in packaging such electronic parts on a printed circuit board according to the intended application. Hence, the packaging density can be increased while avoiding the formation of solder bridges. For example, if the adjacent electronic parts have a covering height H of 3.2 mm and if the height h of their terminals is 1.6 mm as is usually the case, then they must be spaced apart a pattern gap of about 2 mm. According to the invention, the height h of the terminals can be decreased to 0.5 mm and the pattern gap to only 0.7 mm.

Moreover, because the terminals 33a are extended to the outside from the bottom 37′ that provides the mounting place, placement of the electronic part on a printed circuit board permits direct contact of the terminals 33a with the conductor pattern and ensures infallible soldering. The terminals 33a are folded up from the end 37′ against the both end surfaces of the molded assembly and, unlike the ordinary terminals secured to the bottom alone, their soldered conditions can be visually inspected from the outside, avoiding any decrease in the reliability of soldering.

As shown better in FIG. 19, the terminals 33a are built so that each has an electrode connector finger 32a high in the middle and a pair of terminal fingers 32b spaced apart a distance G and located below the middle finger for connection with the inductance element. This construction enables the middle fingers 32b of the terminals to be properly positioned with respect to the inductor, thereby facilitating the manufacture of packaged products.

When the metal terminals 33a of the construction described are employed, the pairs of terminal fingers 32b support the bottom of the inductance element so that the positions of the electrode connector fingers 32a with respect to the terminal electrodes 26 can be accurately controlled on the basis of the height of those fingers 32a from the underlying fingers 32b. The inductance element and the metal terminals 33a, therefore, are accurately located in the direction of the height.

The pair of terminal fingers 32b, spaced apart a distance G and extended in parallel, support the inductance element placed on them, as in FIG. 18, securing part of the bottom of the element in the space G and holding it with the inner edges of the fingers 32b. The element is kept from sliding sideways and is properly positioned laterally.

Since the construction permits mounting of the inductance element from above the metal terminals 33a, the assembling work is easy.

With all the aforesaid advantages combined, the work of combining and jointing the inductance element and metal terminals can be automatized for mass production with enhanced efficiency.

The embodiments of chip inductors according to the invention thus far described have cubic shapes, and the absence of marks or signs indicating the six surfaces, i.e., top and bottom and sides and ends, of the covering 32 makes the identification of the chip position or direction difficult. Automatic directional identification or orientation by parts feeders, etc. has been impossible. Now a third embodiment of the invention which makes this possible will be described. This chip inductor renders possible the identification of the chip direction in a simple but positive way and also positioning of the terminals relative to the conductor pattern of a printed circuit board, testing of inductor characteristics, marking, taping, and packaging.

Figure 19:
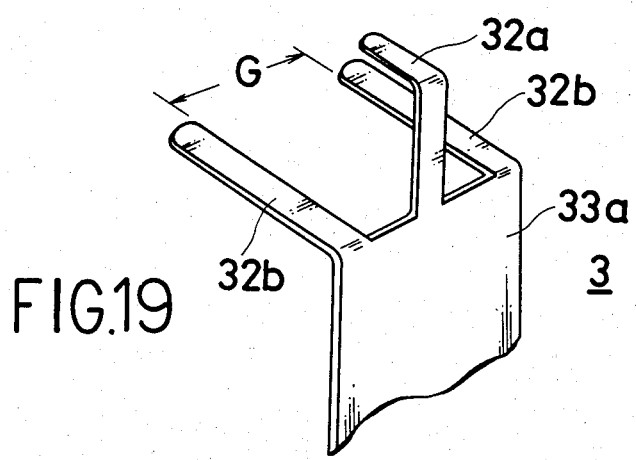
FIG. 19 is a perspective view of the connections of terminals in the second embodiment.
Figure 20:
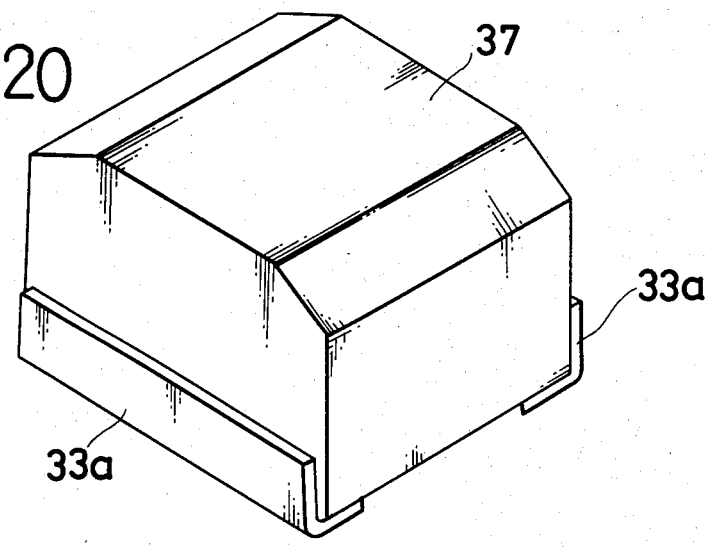
FIG. 20 is a perspective view of a third embodiment of the electronic part in the form of a chip according to the invention.

In FIGS. 20 and 21, which show this embodiment of chip inductor in perspective and in sectional front elevation, respectively, the numerals like those used in FIGS. 18 and 19 designate like or similar parts. The surface d of the covering 37 opposite to the mounting surface a is beveled at two opposing, parallel edges, thus forming signs 40 for directional identification. Alternatively, only one such sign 40 instead of two may be made along one edge of the surface d.

At least one directional identification sign 40 thus formed on the surface d reverse to the mounting surface a of the covering 37 permits ascertainment of whether a given surface is the mounting surface a or the opposite surface d or whether it is either end surface b or c having a terminal 33a or either terminal-free side surface e or f, depending on the presence or absence of the sign 40 on, and the direction of, the particular surface. It is therefore possible to have the presence or absence, direction, etc. of the signs of the chip inductors detected automatically by a mechanical or electrical identification instrument and to carry out subsequent steps of positioning the terminals 33a of chip inductors relative to the conductor pattern of the printed circuit board, testing of the inductor characteristics with the mounting surfaces a turned downward, marking of the surfaces d, taping and packing, all accurately under prescribed conditions.

Since the covering 37 of this embodiment is beveled along edges to provide the directional identification signs 40, automatic identification is made possible with utmost ease through mechanical detection by means of a checker 41, such as a parts feeder, as shown in FIG. 22.

In the embodiment being described, the directional identification signs 40, formed parallelly along two opposing edges of the surface d, ensure very accurate directional identification because, as indicated in FIGS. 22 to 25, the checker 41 has to detect only one of four side positions of the electronic part where the surface d faces it, viz., the instrument can perform quarter directional identification.

Figure 26:
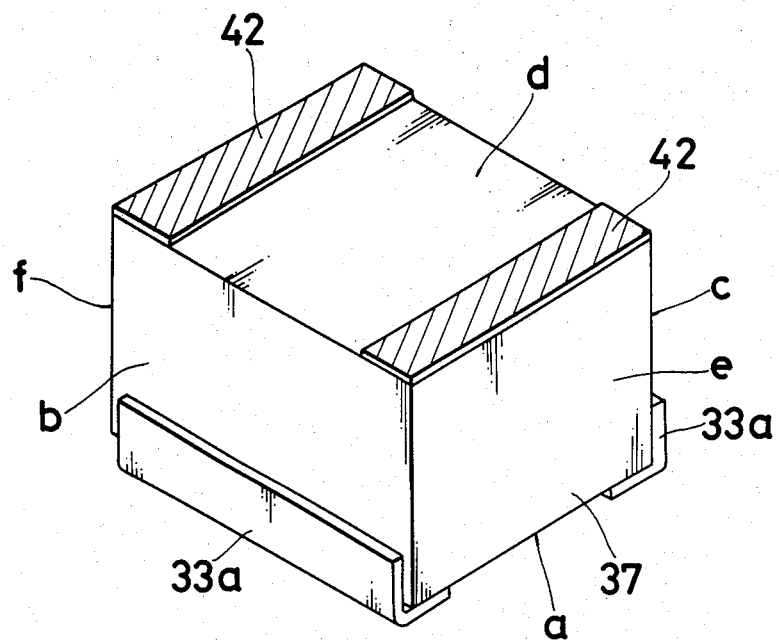
FIG. 26 is a perspective view of a fourth embodiment of the chip-shaped electronic part according to the invention.
Figures 27, 28:
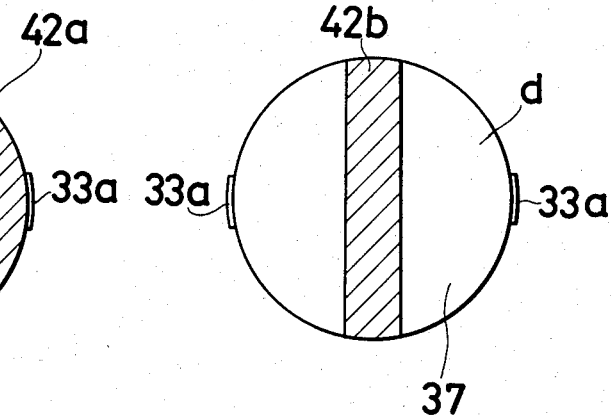
FIGS. 27 through 31 are plan views of modifications of the embodiment in FIG. 26.

While this embodiment has directional identification signs formed by beveling two opposing edges of one surface d of the covering 37, it is alternatively possible, as in a fourth embodiment of FIG. 26, to attach marks 42 of color, material, or other feature discernible from that of the covering 37 along the both edges of the surface d of the electronic part which is again cubic in shape.

In case the marks 42 in this embodiment are colored differently from the rest, the packaged condition of the marked chip conductors on a printed circuit board or the like is photographed by means of a camera tube or optical sensor. On the basis of the picture or data so obtained, a computer determines whether the postures of individual electronic parts are appropriate or not, and the results are visually confirmed and adjustments are made where necessary, with improved accuracy and efficiency.

As stated above, the marks 42 provided on the surface d opposite to the mounting surface a of the covering 37, with a color dissimilar to that of the covering, allows the position or direction of the chip inductor to be identified according to the presence or absence and direction of the marks 42 in sight or in the light path of the sensor. Moreover, the marks 42 are given in the form of straight stripes, which can be easily recognized for judgement of the direction.

Because the computer can determine and record the packaged condition of the electronic parts as chips on the printed circuit board, it is possible to prepare data listing defective packaged parts and on that basis correct the defects of the package rapidly and accurately.

Figure 29:
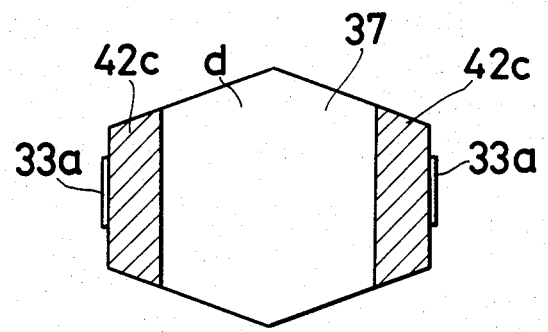

The shape of the covering or molded chip body and the locations and direction of the marks 42 are not limited to those embodied above but many other modifications are possible. Some modifications are illustrated in FIGS. 27 to 31. Only their outward appearances are shown as they are similar in internal structure to the embodiments already shown in FIGS. 15, 18, and 21. In a modified form in FIG. 27, the covering 37 is disc-shaped, and the circular surface d opposite to the mounting surface a (not shown) is provided with a partly circular mark 42a defined by a straight line slicing off a part of the circle. In another modification in FIG. 28, there is a mark 42b in the form of a straight stripe across the middle portion of the circular surface. In FIG. 29 the covering is hexagonally shaped and two marks 42c are provided as parallel stripes along opposing two ends to which terminals 33a have been extended.

Figure 30:
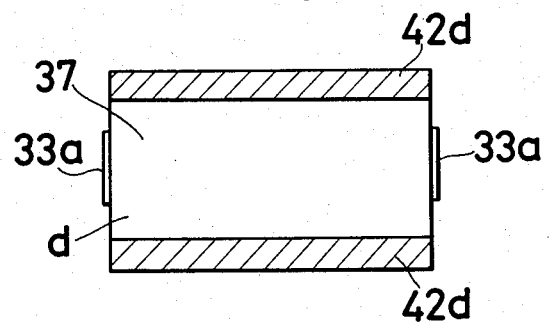
Figure 31:
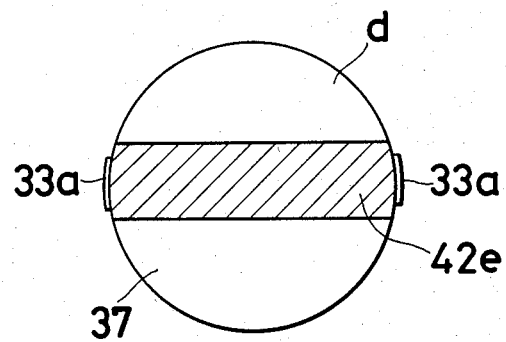

Shown in FIG. 30 is a modification in which marks 42d are formed along the two sides of a rectangular covering 37 at right angles to the sides where terminals 33a are provided. In FIG. 31, terminals 32a are provided at two opposite points diametrally across a circular covering 37, and also a mark 42e in the form of a straight stripe is extended diametrally across the circle, in the direction connecting the terminals.

As has been described above, the modifications in FIGS. 26 to 31 are characterized by marks in the form of straight stripes, colored differently from the original color of the covering, the marks being provided on the surface of the chip opposite to the mounting side. The invention can, therefore, provide electronic parts in the form of chips which, when packaged on a printed circuit board or the like, are photographed by a camera tube or scanned by an optical sensor, and the packaged condition is examined and evaluated with the aid of a computer or other means, so that confirmation and correction can be accomplished with high degrees of accuracy and efficiency.

What is claimed is:

1. An inductor comprising:
   (a) a core having two opposing ends;
   (b) a winding wound about the core;
   (c) a pair of connector electrodes disposed on the ends of the core;
   (d) a pair of terminals connected to the connector electrodes and extending downwardly therefrom, each terminal having a connector finger centrally extending from an upper portion of the terminal for connection to one of the connector electrodes and a pair of spaced apart support fingers parallely extending from an intermediate portion of the terminal supporting the core;
   (e) a covering of molded insulating resin encapsulating the winding, core, and the upper and intermediate portions of the terminals, a lower portion of each terminal protruding through the covering and being bent horizontally along a portion of the bottom of the covering and upwardly along and in contact with at least a portion of the side of the covering.

2. An inductor according to claim 1 in which the core is generally dumbbell-shaped and the winding is wound thereon into a coil, the ends of the coil being connected to the connector electrodes.

3. An inductor according to claim 1 or 2 in which the upwardly folded portion of each terminal has a height less than that of the covering.

* * * * *